(12) United States Patent
Durante et al.

(10) Patent No.: US 10,075,137 B2
(45) Date of Patent: Sep. 11, 2018

(54) POWER AMPLIFICATION SYSTEM FOR RADIOFREQUENCY COMMUNICATIONS

(71) Applicant: TEKO TELECOM S.R.L., Castel San Pietro Terme (IT)

(72) Inventors: Davide Durante, Castel San Pietro Terme (IT); Massimo Notargiacomo, Castel San Pietro Terme (IT); Giovanni Chiurco, Castel San Pietro Terme (IT); Flavia Martelli, Castel San Pietro Terme (IT)

(73) Assignee: Teko Telocom, S.r.l., Castel San Pietro Terme (IT)

( * ) Notice: Subject to any disclaimer, the term of this patent is extended or adjusted under 35 U.S.C. 154(b) by 0 days.

(21) Appl. No.: 15/313,478

(22) PCT Filed: May 22, 2015

(86) PCT No.: PCT/IB2015/053764
§ 371 (c)(1),
(2) Date: Nov. 22, 2016

(87) PCT Pub. No.: WO2015/177757
PCT Pub. Date: Nov. 26, 2015

(65) Prior Publication Data
US 2017/0117855 A1    Apr. 27, 2017

(30) Foreign Application Priority Data
May 23, 2014  (IT) .............................. MO2014A0146

(51) Int. Cl.
*H03F 1/32* (2006.01)
*H03F 3/189* (2006.01)
(Continued)

(52) U.S. Cl.
CPC ........... *H03F 1/3247* (2013.01); *H03F 3/189* (2013.01); *H03F 3/24* (2013.01); *H04B 1/0014* (2013.01);
(Continued)

(58) Field of Classification Search
CPC ..................................................... H03F 1/3247
(Continued)

(56) References Cited

U.S. PATENT DOCUMENTS 6,266,517 B1 * 7/2001 Fitzpatrick ............ H03F 1/3229
  375/296
6,587,514 B1 * 7/2003 Wright .................. H03F 1/3241
  330/149

(Continued)

FOREIGN PATENT DOCUMENTS

GB       2318938 A      5/1998

OTHER PUBLICATIONS

Search Report dated Jan. 20, 2015 from Italian Patent Application No. MO2014A000146 filed May 23, 2014.
(Continued)

*Primary Examiner* — Patricia T Nguyen
(74) *Attorney, Agent, or Firm* — Sunstone IP

(57) ABSTRACT

Power amplification system for radio frequency communications, comprising a input port of an input radio frequency signal, an output port of an output radio frequency signal; a digital predistortion unit operatively interposed between the input port and the output port and quadrature modulation correction means operatively interposed between the digital predistortion unit and between at least one of the input port and the output port.

12 Claims, 3 Drawing Sheets

(51) Int. Cl.
*H03F 3/24* (2006.01)
*H04B 1/00* (2006.01)
*H04B 1/04* (2006.01)

(52) U.S. Cl.
CPC ..... *H04B 1/0475* (2013.01); *H03F 2200/336* (2013.01); *H03F 2200/451* (2013.01); *H04B 2001/0408* (2013.01)

(58) Field of Classification Search
USPC .......................................................... 330/291
See application file for complete search history.

(56) References Cited

U.S. PATENT DOCUMENTS

| | | | | |
|---|---|---|---|---|
| 7,471,736 | B2* | 12/2008 | Ding | H03C 3/40 375/141 |
| 8,452,250 | B2* | 5/2013 | Ishikawa | H04L 27/364 330/149 |
| 2006/0008030 | A1* | 1/2006 | Luke | H04L 27/364 375/298 |
| 2007/0241812 | A1 | 10/2007 | Yang et al. | |
| 2008/0095264 | A1* | 4/2008 | Deng | H03F 1/3247 375/296 |
| 2008/0265996 | A1 | 10/2008 | Kim et al. | |
| 2009/0256630 | A1* | 10/2009 | Brobston | H03F 1/3247 330/2 |
| 2010/0033246 | A1* | 2/2010 | Draxler | H03F 1/3247 330/149 |
| 2013/0243121 | A1* | 9/2013 | Bai | H03F 1/3247 375/297 |
| 2016/0134248 | A1* | 5/2016 | Onishi | H03F 1/3247 330/149 |

OTHER PUBLICATIONS

International Search Report and Written Opinion dated Sep. 28, 2015 from International Patent Application No. PCT/IB2015/053764 filed May 22, 2015.

* cited by examiner

POWER AMPLIFICATION SYSTEM FOR RADIOFREQUENCY COMMUNICATIONS

TECHNICAL FIELD

The present invention relates to a power amplification system for radiofrequency communications.

BACKGROUND ART

Within the scope of mobile communications, considerable efforts have been made in order to use linear modulation techniques to improve spectral and power efficiency.

In particular, one of the biggest challenges in designing modern wireless transceivers consists in the trade-off between linearity and efficiency of RF amplifiers.

On the one hand, in fact, spectrally efficient modulated signals, such as W-CDMA (Wideband Code Division Multiple Access) and OFDM (Orthogonal Frequency-Division Multiplexing) signals, affect the non-linearity of the amplifier, with consequent undesired in-band distortions and out-of-band spectral re-growth. Such distortions therefore involve the violation of the narrow requirements defined by communication standards.

On the other hand, the improvement of the efficiency of the amplifiers results in a significant saving in terms of cooling and running costs.

To this must be added the fact that the use of a simple direct-conversion transmitter is not practical for three main reasons.

First of all, because energy efficiency is one of the necessary requirements of the system, an efficient but non-linear power amplifier must be used. This therefore involves the use of some kind of linearizer so as to reach the spectral efficiency required.

Furthermore, a direct-conversion system is very sensitive to gain imbalance and to phase and DC voltage offset errors of the modulator in quadrature. An accurate control of the errors of the modulator itself therefore becomes necessary.

Finally, both the non-linearity of the power amplifier and the errors of the modulator in quadrature can vary according to the temperature, the channel frequency, the polarization of the device and the degradation of the components. The use is therefore necessary of an instrument for monitoring the power amplifier and the modulator in quadrature.

Consequently, a high-performance direct-conversion transmitter necessarily requires the fitting of a predistortion, a control of the errors of the modulator in quadrature, and the adaptation of both in order to maintain the perfect performance of the system.

Baseband digital predistortion is one of the most effective techniques used to reach greater efficiency in terms of power and in terms of increase of data speed per unit of band width.

The precision and the flexibility of digital predistortion permit using a non-linear amplifier to increase the total energy efficiency in compliance with the stringent performance requirements called for.

Today, the use of digital cellular transmitters with integrated processors has increased the importance of baseband digital predistortion, which benefits from the low manufacturing cost and the high flexibility offered by the design of digital circuits. Consequently, in modern architectures, these algorithms are made in the digital ambit using FPGA (Field Programmable Gate Array) devices adapted to implement digital predistortion algorithms (DPD) and quadrature modulation correction (QMC) algorithms.

As schematically shown by way of example in FIG. 1, the digital predistortion function DPD acts on the data sent for the purpose of cancelling the distortion in the power amplifier PA, implementing a reverse model of the amplifier. The predistortion function is applied to the sequence of sent digital data $x(n)$ and is adapted to model the non-linearity of the amplifier PA.

The estimate of parameters DPD is based on samples of the output $y_0(n)$ and of the input $z(n)$ of the power amplifier PA. In particular, to separate the linear effect of the power amplifier PA and of the circuit that pilots it, the estimate is based on the aligned output $y(n)$. The alignment process considers the variations in amplitude, the delay and the phase variations of $y_0(n)$ compared to $z(n)$.

As shown in the diagram in FIG. 2, in the case of an amplifier RFin to RFout, the input RF IN signal must be reconverted in IF or in baseband (signal IQ), brought to the function of digital predistortion DPD and then converted again into an RF OUT signal. Similarly, the RF OBS signal is converted into IF or into baseband IQ and is brought to the function of digital predistortion DPD.

The architecture described above can be implemented in different ways and the conversions into IF or baseband IQ can be used with relative advantages and drawbacks.

The conversion into/from baseband IQ in analog ambit is the best way to achieve ample band width, high precision and cost optimization, and the more the band width of the RF signal is ample (i.e., up to 75 MHz or more) the more important this becomes. Furthermore, the output path and the observer path (OBS) must necessarily have a band width five times greater (i.e., up to 375 MHz or more) due to the distortions of the third and fifth order which could be introduced by the PA.

Such technique is not without its drawbacks however inasmuch as it calls for identical paths for the way I and the way Q which cannot be achieved in analog ambit.

The gain imbalance and the phase difference between the I and Q paths involve spurious signals that again fall within the transmission band and which cannot be filtered by means of RF or digital filters.

Furthermore, the offset DC (always present in analog components) and the oscillator of the RF converter involve a spurious frequency that falls again at the center of the transmission band.

Neither of the spurious components are negligible and both considerably affect the correct operation of the amplifier.

Conversion into/from IF permits locating the disturbances outside the IF work band, making it possible to filter such disturbances by means of an IF low pass filter and delegating the IQ conversion to digital domain.

The use of an IF conversion nevertheless requires a wider band (theoretically two times but in practice three to four times the signal band envisaged for the IF antialiasing filter) with consequent high speed of data transmission in the A/D and D/A converters, something that represents a far from negligible problem for the D/A output and for the A/D observer inasmuch as, as has been said, these carry a signal which is five times the band width of the input signal (i.e., up to 375 MHz or more).

The purpose of using an algorithm QMC (Quadrature Modulator Correction) is to change the continuous component, the phase and gain of the signal received or sent, so as to offset the errors found by the modulator in quadrature.

With reference to an ideal case, the algorithm QMC would be able to eliminate the birdies in correspondence to the local oscillator frequency and image frequency.

Nevertheless, the errors relating to the continuous component, to the offset and to the phase can increase according to the temperature and time. Consequently, the application of the algorithm QMC in the ambit of real appliances calls for the use of a feedback system which permits estimating such errors and which is able to pilot the appliance so as to correct the errors dynamically.

DESCRIPTION OF THE INVENTION

The main aim of the present invention is to provide a power amplification system for radiofrequency communications which allows better performance in the RF signal amplification.

Another object of the present invention is to provide a power amplification system for radiofrequency communications that allows to overcome the mentioned drawbacks of the prior art within the ambit of a simple, rational, easy and effective to use as well as affordable solution.

The above mentioned objects are achieved by the present power amplification system for radiofrequency communications according to the characteristics described in claim 1.

BRIEF DESCRIPTION OF THE DRAWINGS

Other characteristics and advantages of the present invention will become better evident from the description of a preferred, but not exclusive embodiment of a power amplification system for radiofrequency communications, illustrated by way of an indicative, but non-limiting example in the accompanying drawings wherein.

EMBODIMENTS OF THE INVENTION

With particular reference to such illustrations, S globally indicates a power amplification system for radiofrequency communications.

In particular, the system S is intended for base and repeater radio stations used in mobile technologies of third and fourth generation (3G/4G) and more. Applications of a different type cannot however be ruled out.

Figure 3:
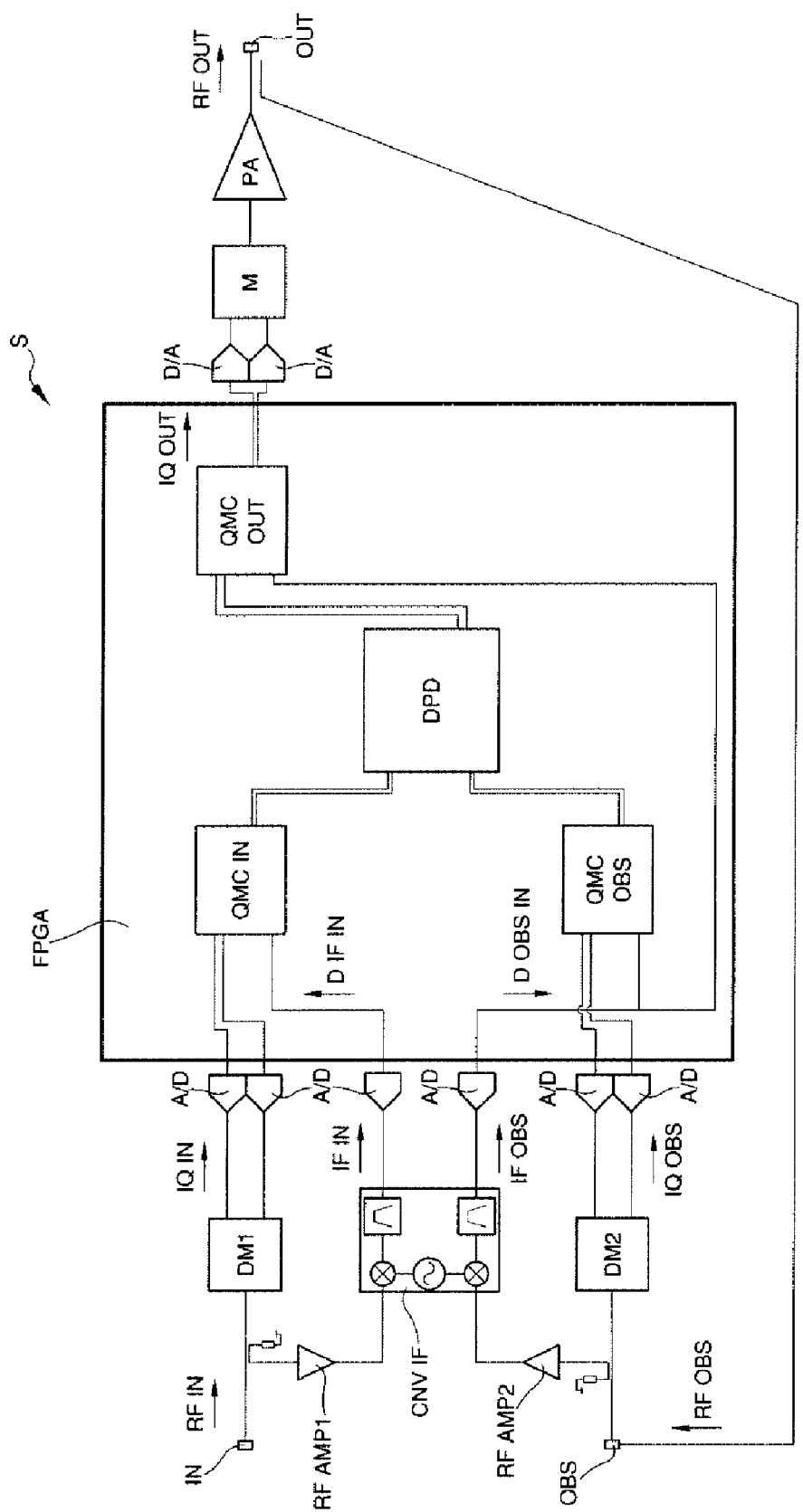
FIG. 3 is a general block diagram illustrating a first possible embodiment of the system according to the invention.

FIG. 3 shows a first possible embodiment of the system according to the invention, described below.

The system S comprises an IN input port of an RF IN input radio frequency signal received, an OUT output port of an RF OUT output radio frequency signal to be sent, an OBS observation port connected to the OUT output port by means of a feedback connection and adapted to receive an RF OBS observed radio frequency signal.

Advantageously, the system S comprises a DPD digital predistortion unit operatively placed between the IN input port, the OUT output port and the OBS observation port and correction means of the modulation in quadrature QMC IN, QMC OUT and QMC OBS operatively placed between the DPD digital predistortion unit and the IN, OUT and OBS ports.

In particular, the system S comprises:
a QMC IN input correction unit operatively interposed between the IN input port and the DPD digital predistortion unit;
a QMC OUT output correction unit operatively interposed between the DPD digital predistortion unit and the OUT output port;
a QMC OBS observation correction unit operationally placed between the OBS observation port and the DPD digital predistortion unit.

Consequently, as shown in FIG. 3, the proposed architecture envisages the use of two correction units QMC IN and QMC OBS on the receiving side, a DPD digital predistortion unit and a QMC OUT correction unit on the transmission side.

Figure 1:
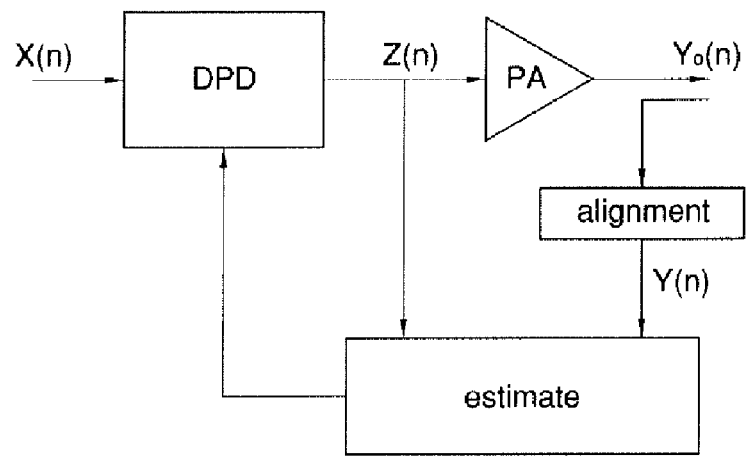
FIG. 1 is a general block diagram illustrating an example of a digital predistortion algorithm of known type.
Figure 2:
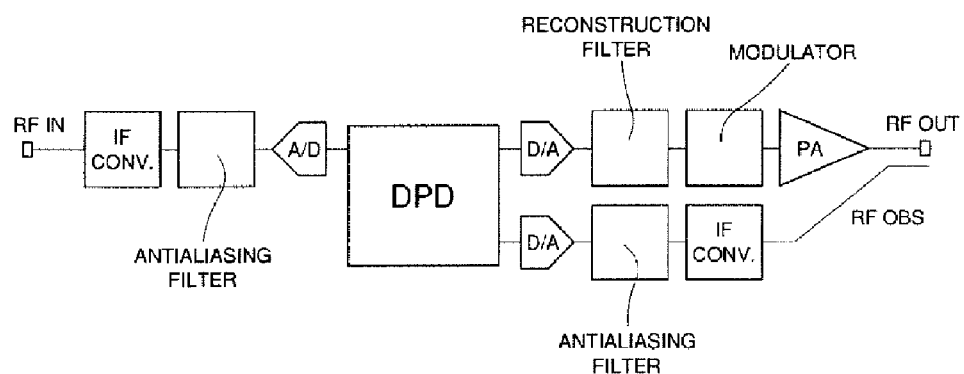
FIG. 2 is a general block diagram illustrating an example of RFin to RFout amplifier of known type.

The DPD digital predistortion unit implements the digital predistortion algorithm (in the same way as schematically shown in the example in FIG. 1) which estimates the coefficients of predistortion to be applied to the transmitted signal.

The DPD digital predistortion unit makes a comparison between the RF IN signal corrected by means of the correction unit QMC IN and the RF OBS signal corrected by means of the correction unit QMC OBS in order to estimate the predistortion coefficients to be applied to the signal to be sent. The output signal of the DPD is then sent to the correction unit QMC OUT.

The system S also comprises a first demodulation unit I/Q, indicated in the illustration by the reference DM1, connected to the input port IN and adapted to convert the RF IN input radio frequency signal into a respective input signal I/Q, indicated in the illustration as IQ IN. In practice therefore, IQ IN is the RF IN radiofrequency signal received and converted into the respective signals I and Q.

Respective A/D analog/digital conversion units are operatively placed between the first demodulation unit DM1 and the correction unit QMC IN. Consequently, the D IF IN digital signal represents the RF IN signal converted into a relative IF signal.

In practice therefore, the correction unit QMC IN corrects the modulation errors due to the first demodulation unit DM1 and to the A/D converter in reception.

The system S also comprises an RF modulation unit, indicated in the illustration by the block M, connected downstream of the correction unit QMC OUT and upstream of the output port OUT and adapted to convert the IQ OUT output I/Q signal into the RF OUT radiofrequency output signal.

Suitable D/A digital/analog conversion units are operatively placed between the correction unit QMC OUT and the modulation unit M.

In practice, therefore, the correction unit QMC OUT corrects the modulation errors due to the modulation unit M and conversion errors D/A of the transmitted RF OUT signal.

In addition, an amplification unit PA is connected upstream of the output port OUT and downstream of the modulation unit M.

A second demodulation unit I/Q, indicated in the illustration by the reference DM2, is connected to said OBS observation port and is adapted to convert the RF OBS observed radiofrequency signal into a respective I/Q observed signal, indicated in the illustration as IQ OBS. In practice therefore, IQ OBS is the RF OBS radiofrequency signal observed and converted into the respective signals I and Q.

Respective A/D analog/digital conversion units are operatively placed between the second demodulation unit DM2 and the correction unit QMC OBS. Consequently, the D IF OBS signal represents the RF OBS signal converted into a relative IF signal.

In practice therefore, the QMC OBS correction unit corrects the errors due to the demodulation performed by the second demodulation unit DM2 and the A/D conversion of the RF OBS signal, which is also affected by the modulator M and the converter D/A of the RF OUT signal in the event of the QMC OUT being disabled.

The system S comprises an intermediate-frequency conversion unit CNV IF connected to the input port IN with interposition of a first RF AMP1 amplifier and adapted to convert the FR IN input radiofrequency signal into a respective intermediate-frequency input signal IF IN. In practice therefore IF IN is the signal received and converted into the IF intermediate frequency.

Moreover, the intermediate frequency conversion unit CNV IF is connected to the observation port OBS and is adapted to convert the RF OBS observed radio frequency signal into a respective IF OBS observed intermediate frequency signal. In practice, therefore, IF OBS is the signal observed and converted into the intermediate frequency IF.

The conversion unit CNV IF therefore has a first IF IN output signal connected to the QMC IN correction unit with interposition of a respective A/D conversion unit.

The CNV IF conversion unit also has a second IF OBS output signal connected to the QMC OBS correction unit and to the QMC OUT correction unit with interposition of respective A/D conversion units.

The IF IN and IF OBS signals are required to allow the correction of the RF IN input, of the RF OUT output and of the RF OBS observed signal respectively. The signal used to correct the modulation errors is necessarily an IF signal so as to prevent the DC, offset and phase errors.

Conveniently, the digital predistortion unit DPD and the quadrature modulation correction units QMC IN, QMC OUT and QMC OBS can be made by means of an electronic board of the Field Programmable Gate Array (FPGA) type.

In particular, the digital part of the system S can be implemented on a baseband operating FPGA board so as to optimize the band amplitude of the input and output signals and so as to improve the DSP (Digital Signal Processing) algorithms of the DPD and of the QMC.

Figure 4:
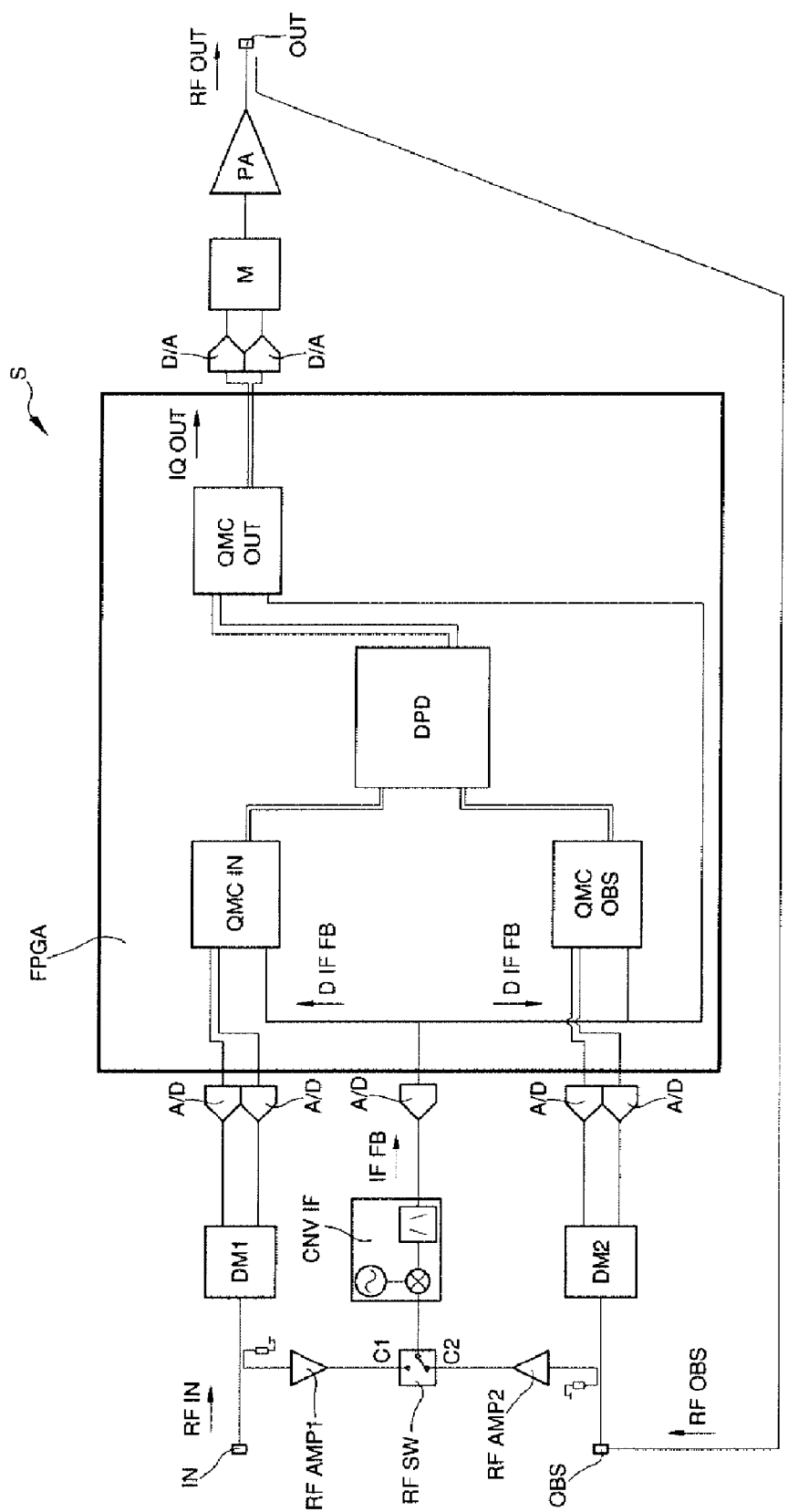
FIG. 4 is a general block diagram illustrating a second possible embodiment of the system according to the invention.

With reference to a second possible embodiment, shown in FIG. 4, the system S comprises an RF switch connected to the CNV IF conversion unit and to the IN and OBS ports and positionable between a first configuration, wherein it connects the IN input port to the CNV IF conversion unit, and a second configuration, wherein it connects the OBS observation port to the CNV IF conversion unit.

In this case, therefore, the system S has the RF SW switch that allows the selection of the feedback signal.

In practice, the RF SW switch is positioned first of all in position C1 on the RF IN signal and, subsequently, in position C2 on the RF OBS signal. The switch is therefore repeated periodically according to a predefined and determinate period depending on the system requirements.

In fact, by means of the use of the RF SW switch, the D IF FB signal in the FPGA circuit can represent the RF IN signal or the RF OBS signal converted into the respective IF signal.

It has in practice been ascertained how the described invention achieves the proposed objects.

In particular, the fact is underlined that in such innovative solution, the DPD algorithm and the QMC algorithm are suitably combined with one another, so as to permit better performance of the RF amplifiers.

In particular, the predistortion permits offsetting the non-linear effects of a PA power amplifier produced during the transmission of a broad band signal. Furthermore, the DPD digital predistortion algorithm acts on baseband signals thereby obtaining all the advantages relating to the I/Q (half band, low-pass filtering).

Three QMC sections are used, at input, output and along the observation path of the DPD block, respectively.

Each QMC section has a respective feedback path of the same RF signal, converted into IF. Such feedback can be used by the QMC algorithm as reference to "clean" the IQ signal.

The advantage of such method is that the IF feedback signal does not require a band width equal to five times the width of the input signal band. In fact, the QMC algorithm operates only on the input signal band.

This is a combination of integrated software and hardware able to make a correction by means of modulation of quadrature in reception and in transmission and a correction by means of predistortion with characteristics that make the solution practical, completely engineerable, sturdy and independent. The proposed algorithm has been designed to operate with various mobile communication standards such as, e.g., WCDMA, WiMAX, CDMA2000, TD-SCDMA, LTE-FDD, LTE-TDD and any of their combinations in a multi-rate configuration.

The invention claimed is:

1. Power amplification system for radio frequency communications, comprising:
   at least one input port of an input radio frequency signal;
   at least one output port of an output radio frequency signal;
   at least one digital predistortion unit operatively interposed between said input port and said output port;
   at least one quadrature modulation correction unit operatively interposed between said digital predistortion unit and between at least one of said input port and said output port;
   at least one observation port connected to said output port and to said at least one quadrature modulation correction unit and adapted to receive an observed radio frequency signal;
   at least one intermediate frequency conversion unit connected to said input port and to said at least one quadrature modulation correction means and adapted to convert said input radio frequency signal into a respective intermediate frequency input signal; and
   at least one switch positionable between a first configuration, wherein it connects said input port to said IF conversion unit, and a second configuration, wherein it connects said observation port to said IF conversion unit.

2. System according to claim 1, wherein said at least one quadrature modulation correction unit comprises at least one input correction unit operatively interposed between said input port and said digital predistortion unit.

3. System according to claim 2, wherein said at least one quadrature modulation correction unit comprises at least one output correction unit operatively interposed between said digital predistortion unit and said output port.

4. System according to claim 3, wherein said at least one quadrature modulation correction unit comprises at least one observation correction unit operatively interposed between said observation port and said digital predistortion unit.

5. System according to claim 1, comprising at least one I/Q quadrature demodulation unit connected to said input port and to said at least one quadrature modulation correction unit and adapted to convert said input radio frequency signal into a respective I/Q input signal.

6. System according to claim 1, comprising at least one I/Q quadrature demodulation unit connected to said observation port and to said at least one quadrature modulation correction unit.

7. System according to claim 1, comprising at least one RF modulation unit connected to said at least one quadrature modulation correction unit and to said output port and adapted to convert an I/Q output signal into said output radio frequency signal.

8. System according to claim 1, comprising at least one amplification unit connected upstream of said output port.

9. System according to claim 1, wherein said intermediate frequency conversion unit is connected to said observation port and is adapted to convert said observed radio frequency signal into a respective observed intermediate frequency signal.

10. System according to claim 1, comprising at least one analog/digital conversion unit operatively interposed between said input port and/or said observation port and said at least one quadrature modulation correction unit.

11. System according to claim 1, comprising at least one digital/analog conversion unit operatively interposed between said at least one quadrature modulation correction unit and said output port.

12. System according to claim 1, wherein said digital predistortion unit and said at least one quadrature modulation correction unit are made by means of an electronic board of the Field Programmable Gate Array type.

\* \* \* \* \*